United States Patent [19]

Aigo

[11] Patent Number: 5,050,316
[45] Date of Patent: Sep. 24, 1991

[54] FILTER-BOX FOR A SPIN DRYER

[76] Inventor: Seiichiro Aigo, 3-15-13, Negishi, Daito-ku, Tokyo, Japan

[21] Appl. No.: 562,627

[22] Filed: Aug. 3, 1990

[30] Foreign Application Priority Data

Aug. 31, 1989 [JP] Japan .................. 1-223241

[51] Int. Cl.⁵ ........................... F26B 17/24
[52] U.S. Cl. .......................... 34/58; 34/69; 34/187; 361/213
[58] Field of Search ............ 34/58, 8, 184, 187, 34/69, 188; 361/229, 213, 230

[56] References Cited
U.S. PATENT DOCUMENTS 4,445,281  5/1984  Aigo ........................ 34/58
4,489,502  12/1984  Aigo ........................ 34/58

Primary Examiner—James C. Yeung
Attorney, Agent, or Firm—Wegner, Cantor, Mueller & Player

[57] ABSTRACT

An improved filter-box positioned on a spin dryer is disclosed, which has a ceiling plate, a bottom plate and an annular filter provided between the ceiling plate and the bottom plate. The inner area of the lower surface of the ceiling plate within the filter is downwards convex so that the center of the inner area locates at the lowermost portion thereof. This convex form of the lower surface ceiling guides introduced air to the central lowermost portion of the same and prevents fine dust from accumulating on the lower surface of the ceiling plate. A static electricity removing member is mounted on the lowermost portion of the ceiling plate. The member includes an ionizer to effect the ionization of the introduced air, guided by the convex surface.

4 Claims, 3 Drawing Sheets

FILTER-BOX FOR A SPIN DRYER

BACKGROUND OF THE INVENTION

1) Field of the Invention

This invention relates to an improvement in a spin dryer to remove water droplets stuck on the surface of semiconductor wafers by centrifugal force and to dry the same and, in particular, to a filter-box positioned on such a spin dryer.

2) Description of the prior art

This kind spin dryer comprises of a casing and a rotor rotated in the casing. Semiconductor materials to be dried, usually called wafers, are housed in a carrier, the carrier being in turn housed in a cradle to be set in a predetermined position on the rotor. There is provided a lid having a suction port formed therein, with a filter or a filter-box disposed above the rotor. The casing has an exhaust port at a suitable position in its peripheral wall. Rotation of the rotor generates a negative air pressure in the central zone of the rotor, which draws air through the filter into the rotor, so the air is filtered. The introduced air flows through the rotor to the peripheral wall of the casing and flows out through the exhaust port. Such an air stream dries the wafers set on the rotor.

In this process, the wafers have a static electric charge which has undesirable influence on the semiconductor wafers so that the wafers are apt to attract dust or foreign particles.

In the commonly accepted technique for removing such static electricity, for example, an arrangement disclosed in Japanese U. M. Laid-open gazette No. 62433/1987 is used. This known arrangement shown in the above described gazette is shown in FIG. 8. There are some corona electrodes (c) located at suitable positions on the periphery of the suction port lid above the rotor. The electrodes serve to ionize the air introduced through the filter (d) of the suction port in order to remove static electricity on the wafers. However, according to this arrangement, air passing through the central area of the suction port and through the areas between the electrodes will not be ionized, and thus the amount of ionized air is not enough.

Also, another arrangement in the prior art such as is shown in FIG. 9 was known, in which a filter-box (e) is located above the rotor. This known filter-box has an annular filter (f) and ionizers (g) which consist of corona electrodes that are equally spaced on the inner periphery of the filter. Although this type of filter-box has merit in that it can accommodate a high quality filter such as the so-called Hepafilter or Ulpa-filter, it is accompanied with some problems which are described below.

Usually, in the process of spin drying, static electricity of 30,000–50,000 Volts is generated on the semiconductor wafers. As shown in FIG. 10, there are two streams of introduced air, one of which passes in touch with or near to an ionizer (g) so thereby is ionized, but the of which does not pass near to an ionizer so that it is not ionized. Accordingly, the amount of ionized air is not enough, which results in the incomplete removal of static electricity from the wafers. This leads to a reduction of the above voltage value of static electricity to 5,000–10,000 Volts. In addition thereto, since the lower surface of the ceiling plate of the prior art filter-box is a flat plane there is a stagnant space just under the central area of the lower surface ceiling, Thus, this stagnation of air in the central area accumulates fine dust or particles that pass through the filter, on the lower surface of the ceiling plate. Such accumulated dust will eventually be separated from the lower surface and be attached to the wafers, set in the rotor and thereby stain the same.

SUMMARY OF THE INVENTION

Therefore, the object of the invention is to solve the aforementioned drawbacks of the prior art, and thus, to provide an improved filter-box for a spin dryer which enables the effective removal of static electricity on semiconductor wafers as well as prevents fine dust from accumulating on the lower surface of its ceiling plate.

In attaining the above object, a filter-box for a spin dryer according to the invention has a ceiling plate, a bottom plate and an annular filter provided between the both plates. The inner area of the lower surface of the ceiling plate within the filter is downwardly convex in shape so that the center of the inner area is located at the lowermost portion thereof. This convex form of the lower surface ceiling guides the introduced in to the central lowermost portion of the same and prevents fine dust from accumulating thereon. The lowermost portion of the ceiling plate is provided with a static electricity removing member, which has an ionizer or ionizers to effect the ionization of the introduced air.

DETAILED DESCRIPTION OF THE INVENTION AND THE PREFERRED EMBODIMENTS

Figure 1:
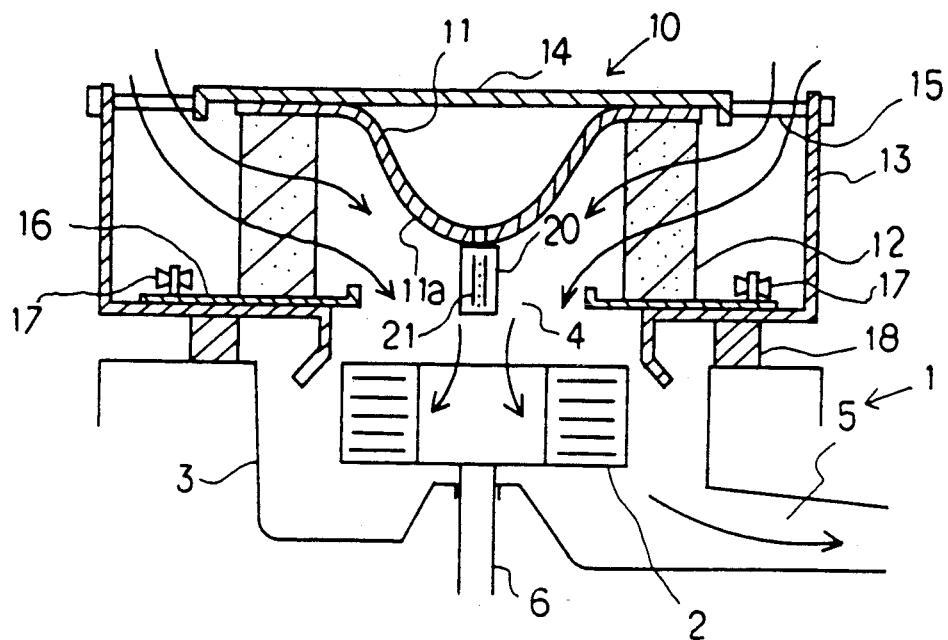
FIG. 1 is an elevational cross-sectional view of a filter-box for a spin dryer, as an example, according to the present invention.

The invention will now be described with reference to the preferred embodiments. FIG. 1 shows the entirety of a spin dryer having thereon a filter-box embodied by the invention. As shown in the Figure, this filter-box is positioned on the body (1) of the spin dryer. The numeral (2) denotes the rotor of the spin dryer, and the numeral (3) is the casing surrounding the rotor. The suction port (4) is located above the rotor and the exhaust port (5) is at a position on the peripheral wall of the casing (3). The rotor (2) is secured to a vertical axis (6) and driven, by way of the axis, by an electric motor. As shown with arrows in FIG. 1, air introduced in the apparatus flows, as in a conventional one, through a filter-box (10) and then through the suction port (4) to the rotor (2), then passes through the rotor and discharges through the exhaust port (5).

Figure 2:
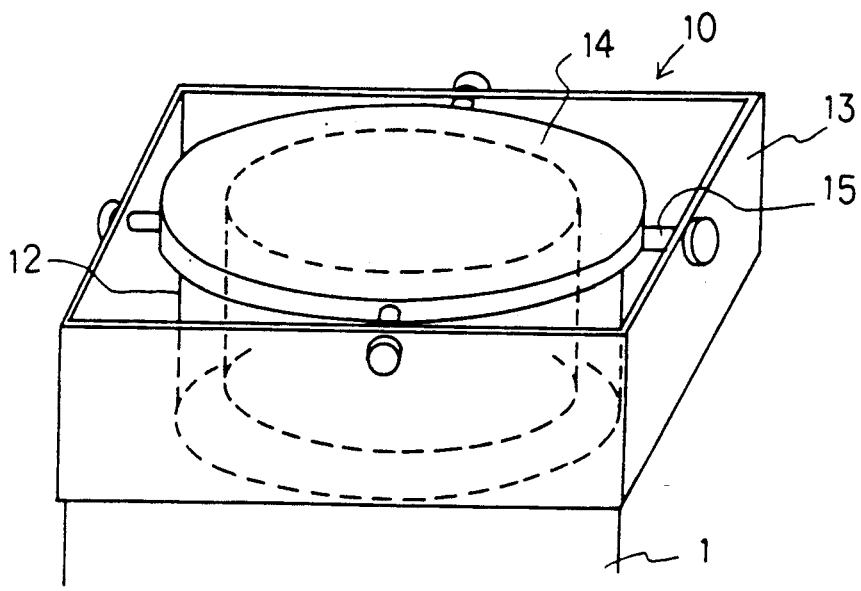
FIG. 2 is a perspective view of the filter-box shown in FIG. 1.

Also, the filter-box (10) includes a ceiling plate (11) and an annular filter (12) positioned below the ceiling plate. Air is introduced inwardly through the annular filter (12) from therearound, and flows downwardly into the rotor (2). Usually, an outer frame (13) made of aluminum or a layered plate is positioned outside the filter so as to form a contour coincident with the upper surface of the casing (3) as shown in FIG. 2. If desired, a cover plate (14) will be mounted on the ceiling plate (11). The numeral (15) denotes a connecting member to connect the ceiling plate or the cover plate to the outer frame (13). Further, there is provided a circular bottom plate (16) having a central opening. This bottom plate is positioned below the filter (12) and secured to the outer frame (13) by means of set-screws (17). In the Figures, the numeral (18) denotes a sealing ring.

The feature of this filter-box (10) is, as shown in FIG. 1, in the ceiling plate (11) of which the lower surface has a downwardly convex form so that its central portion forms the lowermost portion. And, the central lowermost portion of the lower surface ceiling is provided with a static electricity removing member (20) incorporating an ionizer or ionizers.

Figure 3:
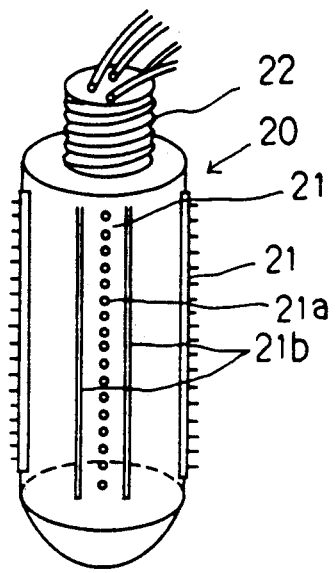
FIG. 3 is a perspective view, showing an example of a static electricity removing member used in the filter-box of the invention.

The static electricity removing member (20) has a body made of fluororesin, polypropylene or vinyl chloride and as shown in FIG. 3, is preferably cylindrical. Also, the member (20) is provided with one or more ionizers (21) on the periphery thereof, and preferably it includes a plurality of them, especially three or four ionizers (21) equally spaced around the body of the member (20). The respective ionizers have electrodes (21a) and (21b) to thereby generate corona-discharge therebetween, which serves to change adjacent air to ionized air. This member (20) has a mounting portion (22) at the top end thereof, to be mounted on the central lowermost portion of the convex lower surface (11a) of the ceiling plate by a threaded engagement or the like. Additionally, the respective ionizers (21) are preferably arranged with their axes being oriented parallel with the axis of the member (20) as shown in the Figures.

Figure 4:
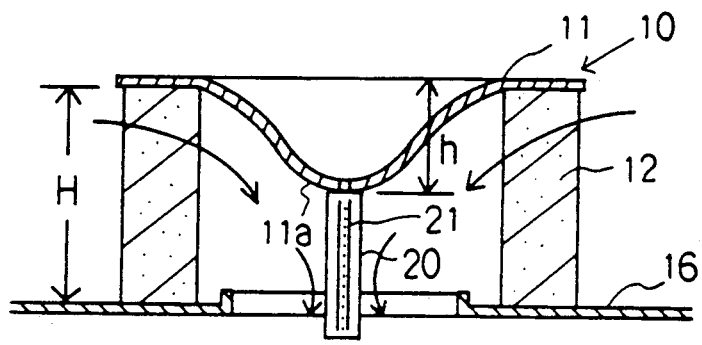
FIG. 4 is a vertical cross-sectional view, showing an example of a preferred embodiment of the invention.

The ceiling plate (11) is usually made of a metal such as Al-alloy or stainless steel. Thus, the convex form can be formed preferably by deep drawing method. Then, the convex surface (11a) will be formed simultaneously with the formation of the ceiling plate. FIG. 4 shows an example of the ceiling plate formed by a deep drawing method.

Also, in order for the form of the convex (11a) to be A Hepafilter, as in the prior art, can the filter (12), preferably $\frac{1}{3}$-$\frac{1}{2}$ of the height (H). This convex portion (11a) can be provided by any convex-formed block to be secured to the lower surface of the ceiling plate (11) for example with threaded screws or the like.

Figure 5:
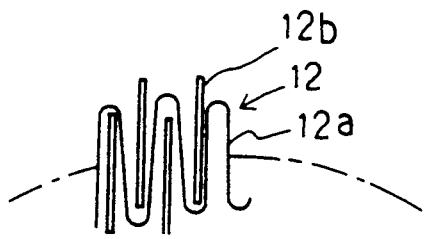
FIG. 5 is a partial plan view of a filter used in the filter-box of the invention.

As the filter (12), as in the prior art, Hepa-filter will be used as the filter (12) which can normally remove dust or particles larger than 0.3μ, or an Ulpa-filter can also be used which can remove dust larger than 0.1 [2. Such a filter consists of fibrous material (12a) and separators (12b), and is shown in FIG. 5. The fibrous material is woven side by side and interlaced with many separators so as to form an annulus. This fibrous material (12a) usually consists of glass-fibrous paper, and the separators (12b) will be made of kraft paper or aluminum. Further, instead of this filter, another one with a different arrangement can be used.

In the operation of such a spin dryer, air is introduced into the rotor through the filter-box (10) due to the rotation of the rotor (2). The introduced air passing through the filter is guided by the convex lower surface of the ceiling plate (11), that is, the air flows along the convex surface and then in touch with or near to the static electricity removing member (20) mounted on the lowermost portion of the convex surface so as to be effectively ionized, and down into the rotor (2).

Figure 6:
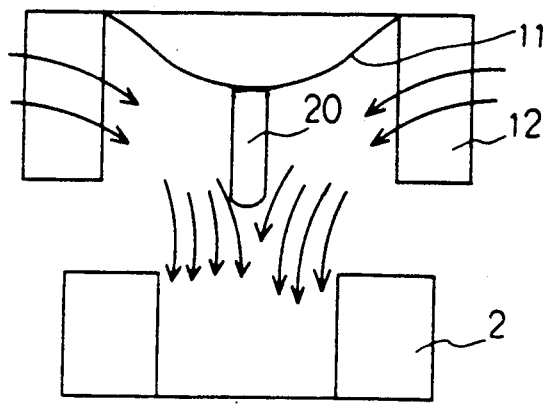
FIGS. 6 and 7 are respectively a schematic view of a spin dryer and a filter-box of the invention, which shows air flow therein.
Figure 7:
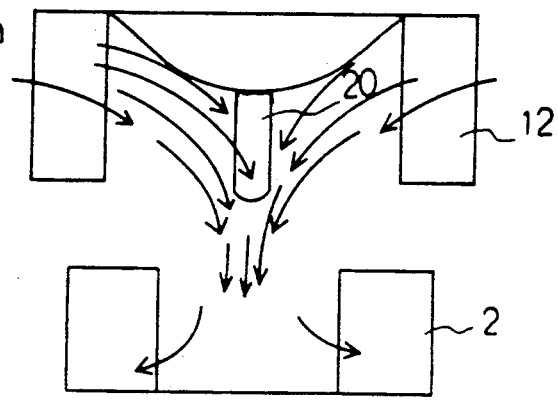
Figure 8:
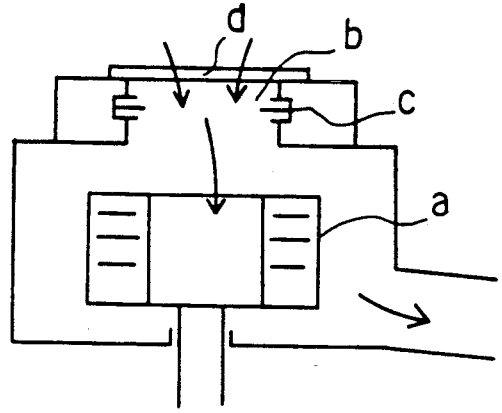
FIG. 8 is a schematic vertical cross-sectional view showing a spin dryer provided with a prior art filter-box.
Figure 9:
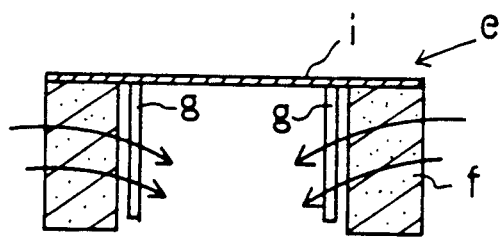
FIG. 9 is a vertical cross-sectional view, showing another type of prior art filter-box.
Figure 10:
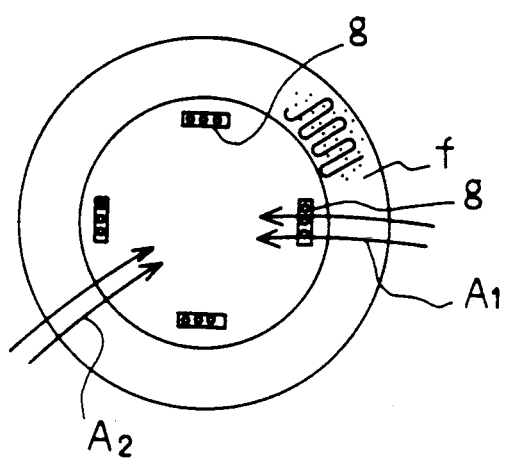
FIG. 10 is a schematic plan view of the prior art filterbox shown in FIG. 9.

If the rotor (2) rotates at a lower speed such as 300-400 rpm, the air flow introduced into the rotor through the filter-box (10) will be distributed comparatively evenly over the suction port (4), as shown in FIG. 6. Whereas at the higher speed range of 800-1200 (the at which speed this type of spin dryer is driven), such an air flow will concentrate on the central area on the way from the interior of the filter-box (10) to the rotor, as shown in FIG. 7, so that most of the introduced air contacts or flows near to the static electricity removing member (20). Therefore, most of the introduced air will be ionized, and also no stagnation or dead space at the central area of the inner surface of the ceiling plate (11) in the filter-box will be formed. In this case, the lower end of the member (20) is desirably at a level a little lower than the bottom face of the filter (12). Accordingly, the semiconductor wafers set in the rotor (2) are dried with air flowing therethrough, and static electricity on the semiconductor wafers is removed by the ionized air. For example, according to the filter-box of the invention, the static electricity remaining on the semiconductor wafers after spin-drying is reduced to a degree of 1000 Volts or less, while the conventional one reduces it to 5000-1000 Volts.

As mentioned above, the filter-box of the invention can remove static electricity on semiconductor wafers and therefore avoids the undesirable influence of static electricity on the wafers. In addition thereto, there is no stagnation of air on the lower surface of the ceiling plate of the filter -box, so that this avoids accumulation of fine dusts on the lower surface ceiling. Accordingly, it is possible to dry semiconductor wafers effectively.

Having now fully described the invention, it will be apparent to one of ordinary skill in the art that many changes and modifications can be made thereto without departing from the spirit or scope of the invention as set forth herein.

What is claimed is:

1. A filter-box which is positioned on a spin dryer for use in drying semiconductor wafers, said filter-box comprising:
    a ceiling plate, said ceiling plate being downwardly-convex in shape so that a center portion of said ceiling plate forms its lowermost portion;
    a bottom plate;
    an annular filter provided between the ceiling plate and the bottom plate;
    means for introducing air through the filter into the spin dryer from an upper zone of the spin dryer; and
    a static electricity removing member having ionizer means for ionizing air, said static electricity removing member being provided on the lowermost portion of said ceiling plate so that the air introduced through the filter is guided to the ionizer means to effect the ionization of air prior to being introduced into the spin dryer.

2. A filter-box for a spin dryer set forth in claim 1, wherein the said static electricity removing member is cylindrical and has a plurality of ionizers, angularly, equally spaced from each other.

3. A filter-box for a spin dryer set forth in claim 1, wherein the said static electricity removing member is vertically positioned with the lower end being lower than the bottom plate.

4. A filter-box for a spin dryer set forth in claim 1, wherein the convexity of the lower surface of the ceiling plate consists of a curved surface.

* * * * *